United States Patent [19]
Ohta

[11] Patent Number: 4,994,754
[45] Date of Patent: Feb. 19, 1991

[54] DIGITAL FM DEMODULATING APPARATUS

[75] Inventor: Haruo Ohta, Yawata, Japan

[73] Assignee: Matsushita Electric Industrial Co., Inc., Osaka, Japan

[21] Appl. No.: 356,327

[22] Filed: May 23, 1989

[30] Foreign Application Priority Data

May 24, 1988 [JP] Japan ................................ 63-126433

[51] Int. Cl.$^5$ ................................................ H03D 3/00
[52] U.S. Cl. ..................................... 329/318; 329/320; 329/336
[58] Field of Search ............... 329/318, 320, 326, 327, 329/336, 372

[56] References Cited

U.S. PATENT DOCUMENTS

| | | |
|---|---|---|
| 4,090,145 | 5/1978 | Webb . |
| 4,096,360 | 6/1978 | Takahashi et al. ............. 329/326 X |
| 4,203,134 | 5/1980 | Christopher et al. . |
| 4,629,994 | 12/1986 | Shimotashiro et al. . |
| 4,757,390 | 7/1988 | Mehrgardt et al. .................. 358/310 |
| 4,851,785 | 7/1989 | Gehrt et al. . |

FOREIGN PATENT DOCUMENTS

| | | |
|---|---|---|
| 0169930 | 2/1986 | European Pat. Off. . |
| 0226456 | 6/1987 | European Pat. Off. . |
| 0278551 | 8/1988 | European Pat. Off. . |
| 61-43083 | 3/1986 | Japan . |

Primary Examiner—Robert J. Pascal
Attorney, Agent, or Firm—Wenderoth, Lind & Ponack

[57] ABSTRACT

A digital FM demodulating apparatus includes a phase detector for detecting the phase of an input digital FM signal; a differentiator for time differentiating the signal from the phase detector to get an instantaneous frequency of the input FM signal; an over-modulation detector for detecting an over-modulation occurence of the input FM signal according to the instantaneous frequency to generate a detection signal, and an over-modulation corrector for obtaining a demodulated output signal which is corrected so as to have no deterioration due to the over-modulation occurrence according to the detection signal from the over-modulation detector.

5 Claims, 4 Drawing Sheets

DIGITAL FM DEMODULATING APPARATUS

BACKGROUND OF THE INVENTION

1. Field of the Invention

The present invention relates to a digital FM demodulating apparatus for demodulating a frequency-modulated (FM) signal to be used for a signal recording/reproducing system such as a video cassette recorder (VCR), video disc player, and the like.

2. Description of the Prior Art

In recent years, for improving the home use so as VCRs to have higher performance, higher function, and more rationalized circuit configuration, attempts have been made to perform the signal processing for recording and reproducing by means of digital signal processing.

With respect to the FM demodulation of the reproduced FM signal of a VCR, a digital FM demodulating apparatus is disclosed in the paper, "DIGITAL SIGNAL PROCESSING IN VIDEO TAPE RECORDERS", by Sonke Mehrgardt, IEEE Trans. on Consumer Electronics, Vol.CE-31, pp374, August 1985.

By the way, the FM signal reproduced from a magnetic tape has suppressed upper sideband signals and emphasized lower sideband signals. This would frequently cause the reproduced FM signal to be over-modulated. Therefore, the signal demodulated by the abovementioned digital FM demodulating apparatus is damaged at the over-modulated portions. As a result, the image produced by the demodulated signal inversely drops into a black level in the portion where the signal should rise up from a black level to a white level, thereby producing a degraded image.

Another problem is that the dynamic range of the demodulated signal becomes extremely large when, even if no over-modulation phenomenon occurs, the lower sideband signal of the reproduced FM signal is relatively large compared to the upper sideband signal. Therefore, the number of bits for expressing the signal must be large, involving a problem of enlargement in the succeeding circuit scale. On the other hand, if amplitude limitation is made by an ordinary amplitude limiter to reduce the dynamic range, the level of the direct current component of the signal would be changed.

SUMMARY OF THE INVENTION

An object of the present invention is to provide a novel digital FM demodulating apparatus which demodulates an FM signal without degradation even if the FM signal has suppressed upper sideband signals and emphasized lower sideband signals.

Another object of the present invention is to provide a novel digital FM demodulating apparatus which demodulates an FM signal without enlargement of the dynamic range of the demodulated signal.

These objects can be accomplished by a digital FM demodulating apparatus comprising: a phase detection means for detecting a phase of an input FM signal; a differentiation means for time differentiating an output signal from said phase detection mean so as to thereby obtain a demodulated signal in proportion to an instantaneous frequency of said input FM signal; an over-modulation detection means for detecting an occurrence of an over-modulation of said input FM signal according to an amplitude value of said demodulated signal from said differentiation means to generate a detection signal; and a correction means responsive to the detection signal for correcting the demodulated signal from the differentiation means to obtain a demodulated output signal which is corrected of has deterioration due to said over-modulation corrected.

The above and other objects, features and advantages will be apparent from consideration of the following description given hereinbelow.

BRIEF DESCRIPTION OF THE DRAWINGS

The present invention will be better understood from the detailed description given hereinbelow in reference to the appended drawings which are given by way of illustration only and are not limitative of the invention, wherein.

DESCRIPTION OF THE PREFERRED EMBODIMENTS

Prior to the description of a preferred embodiment of the present invention, a description is provided made on the over-modulation phenomenon in a VCR.

The over-modulation phenomenon occurs from the fact that, in an FM signal reproduced from a magnetic tape, the upper sideband signal is suppressed and the lower sideband signal is emphasized. In examining the relationship between this over-modulation phenomenon and the instantaneous frequency of the FM signal reproduced by a VCR, for simplification it is assumed that in the reproduced FM signal, the upper sideband signal is fully attenuated, and for the lower sideband signal, only the first lower sideband signal is considered. Then, the reproduced FM signal v(t) is assumed to be expressed by the following equation:

$$v(t) = \cos \omega_c t - \lambda \cos(\omega_c - \omega_m)t \quad (1)$$

where, $\omega_c$ is a carrier angle frequency of the FM signal, and $\omega_m$ is an angle frequency of the demodulated signal. In equation (1), the first term, $\cos \omega_c t$, shows a carrier component wherein the amplitude is normalized to 1, and the second term, $\lambda \cos(\omega_c - \omega_m)t$, shows a lower sideband component. The lower sideband component has an amplitude which is $\lambda$ times that of the carrier component.

The equation (1) can be further modified as follows:

$$\left. \begin{array}{rl} v(t) &= \sqrt{1 + l^2 - 2l\cos \omega_m t} \cdot \cos \theta \\ \theta &= \omega_c t + \tan^{-1} \dfrac{l \sin \omega_m t}{1 - l \cos \omega_m t} \end{array} \right\} \quad (2)$$

Now, the instantaneous angle frequency $\omega$ ($=2\pi f$) of v(t) represented by equation (2) is obtained by time differentiating the phase $\theta$ to become as follows:

$$\omega = \frac{d\theta}{dt} = \omega_c - \frac{l\omega_m(l - \cos \omega_m t)}{1 + l^2 - 2l\cos \omega_m t} \quad (3)$$

Figure 1:
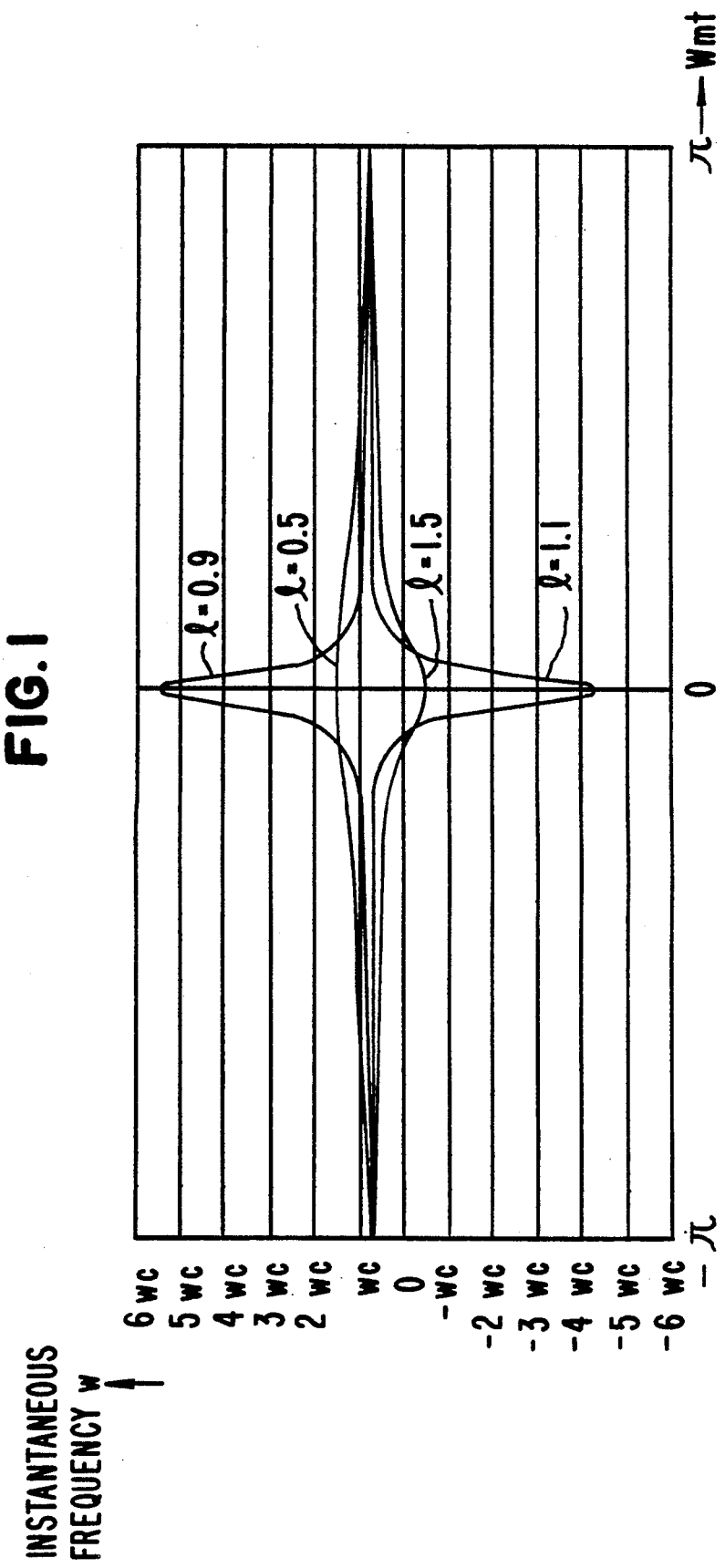
FIG. 1 is a chart for illustrating the over-modulation phenomenon.

The instantaneous angle frequency $\omega$ obtained by varying $\omega_m t$ from $-\pi$ to $+\pi$ using the equation (3) is shown in FIG. 1 with $\lambda$ as a parameter. As apparent from Fig. 1, as $\lambda$ approaches 1 from 0, the amount of the instantaneous angle frequency $\omega$ at $\omega_m t=0$ becomes larger. When $\omega$ exceeds 1, i.e., when the amplitude of the lower sideband signal exceeds the amplitude of the carrier component, an over-modulation phenomenon occurs, at which time the amount of the instantaneous angle frequency $\omega$ at $\omega_m t=0$ becomes smaller than the carrier angle frequency $\omega_c$. Especially, when $\lambda$ is in the range to satisfy the following equation, the instantaneous angle frequency $\omega$ at $\omega_m t=0$ becomes a negative value.

$$l < 1 + \frac{\omega_m}{\omega_c - \omega_m} \quad (4)$$

From the above, it is seen that, by detecting that the instantaneous frequency is smaller than a predetermined value, the over-modulation phenomenon can be detected. Alternatively, in the reproduced signal of a VCR, in order to satisfy the equation (4) in general, one can detect that the instantaneous frequency is negative.

Next, an explanation is provided as to how the over-modulation phenomenon, when detected as noted above, should be corrected. When, in equation (3), the values of t in $\omega_m t$ are averaged from $-\pi$ to $+\pi$, the relationship becomes as follows:

$$\frac{\omega_m}{2\pi} \int_{-\pi/\omega_m}^{\pi/\omega_m} \omega \, dt = \begin{cases} \omega_c & (l < 1) \\ \omega_c - 2\pi & (l > 1) \end{cases} \quad (5)$$

According to equation (5), in the case of $\lambda<1$, i.e., when there is no over-modulation phenomenon, the average value over one cycle of the modulated wave is equal to $\omega_c$. Accordingly, even if waveform distortion has occurred as in the case of $\lambda=0.9$ in FIG. 1, by eliminating a higher order harmonic distortion component by band limiting, a distortion-free demodulated output is obtainable, without causing a variation of the direct current component. However, in the case of $\lambda<1$, i.e., when an over-modulation phenomenon is involved, not only does the value of the instantaneous angle frequency $\omega$ at $\omega_m t=0$ becomes smaller than the carrier angle frequency $\omega$ but also the average value over one cycle of the modulated wave is smaller by $2\pi$ than $\omega_c$. Accordingly, a variation takes place in the direct current component in the demodulation output To prevent this, it is seen that, when an over-modulation phenomenon has been detected, a value corresponding to $2\pi$ must be added to the one-time over-modulation phenomenon.

As described above, by detecting that the instantaneous frequency is smaller than a predetermined value, the over-modulation phenomenon can be detected. Further, when an over-modulation phenomenon has been detected, it can be corrected by adding a value corresponding to $2\pi$ to the demodulation output on one-time over-modulation phenomenon.

Based on the abovementioned consideration on the over-modulation phenomenon, a description is provided made hereinbelow on an embodiment of the FM demodulation system of the present invention with reference to the drawings.

Figure 2:
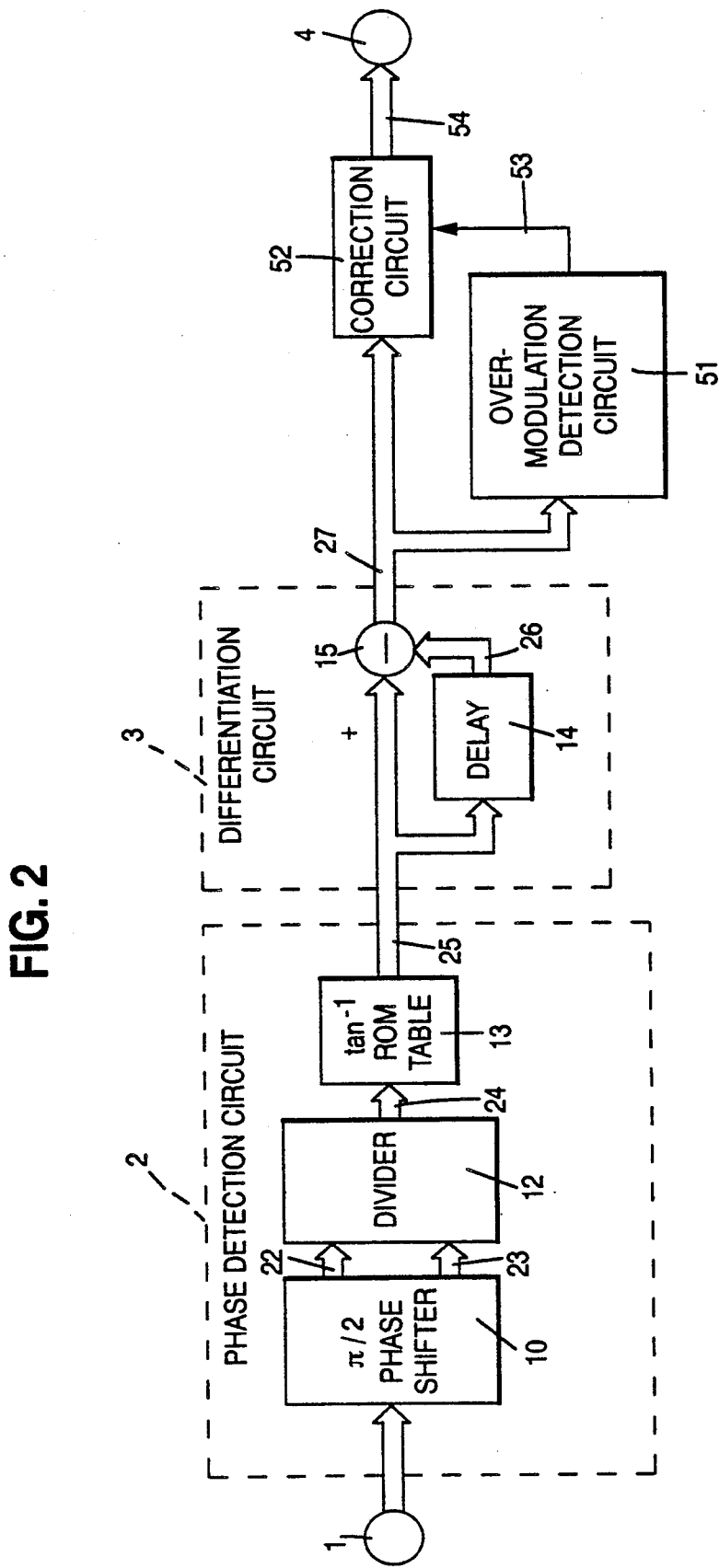
FIG. 2 is a block diagram of a digital FM demodulating apparatus in accordance with an embodiment of the present invention.

FIG. 2 shows a block diagram of a preferred embodiment of the invention which is a digital FM demodulating apparatus.

In FIG. 2, a digitized FM signal is inputted to an input terminal 1. The FM signal may be, for example, reproduced from a recording medium such as a tape or a disk.by an appropriate known reproducing means.

In a phase detection circuit 2, by means of a $\pi/2$ phase shifter circuit 10 which is implemented by a Hilbert transformer or the like, the input FM signal is converted into two signals 22 and 23 which are different in phase by $\omega/2$ from each other. One of the two signals 22, 23 is divided by the other in a divider 12 to obtain a signal 24. Now, assuming that the signal 22 represents $\sin\theta$ and the signal 23 $\cos\theta$, the signal 24 becomes a signal which represents $\tan\theta$. Then, the signal 24 is inputted to a read-only-memory (ROM) 13 having stored therein values of the arc-tangent function as a table to provide a signal 25 representing the phase $\theta$ as an output signal. The signal representing the phase $\theta$ detected by the phase detection circuit 2 is inputted to a differentiation circuit 3.

The differentiation circuit 3 comprises a delay circuit 14 for delaying the input signal 25 by one sampling period to obtain a delayed signal 26 and a subtraction circuit 15 for subtracting the signal 26 from the signal 25 to approximately perform time differentiation to obtain a signal 27. As a result, the signal 27 is a demodulated signal proportional to the differentiated amount of the phase of the inputted FM signal, i.e. to the instantaneous frequency of the inputted FM signal. That is, the phase detection circuit 2 and the differentiation circuit 3 constitute, a conventional FM demodulator.

The demodulated signal 27 is inputted to an over-modulation detection circuit 51 and an over-modulation correction circuit 52.

Figure 3:
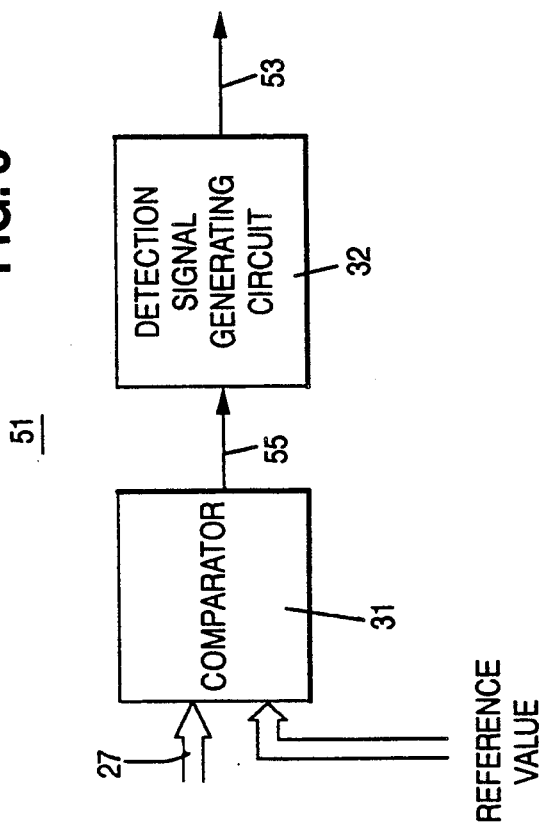
FIG. 3 is a block diagram of an over-modulation detection circuit used in the embodiment of the present invention.

The construction of the over-modulation detection circuit 51 is shown in FIG. 3. A comparator 31 compares the value of the signal 27 at each sampling point with a predetermined reference value and produces a signal 55 which becomes a high level when the value of the signal 27 is smaller than the reference value (i.e., an over-modulation is occurring) and otherwise a low level. Thus, the signal 55 becomes a pulse signal whose duration corresponds to a duration of one over-modulation phenomenon. Usually, one over-modulation phenomenon lasts for one to three sampling periods. As described before, an error of the demodulated signal caused by one over-modulation phenomenon can be corrected by adding a value corresponding to $2\pi$ to the demodulated signal. So, an over-modulation detection signal may be produced once at any one sampling point within the duration of or near the pulse signal 55. A detection signal generating circuit 32 generates such a detection signal 53. That is, the detection signal 53 is a single pulse occurring at one sampling point within the duration of or near the pulse signal 55. The detection signal 53 may be easily generated by using the sampling clock and the leading or trailing edge of the pulse signal 53.

Referring again to FIG. 2, the detection signal 53 described above is fed to the correction circuit 52.

Figure 4:
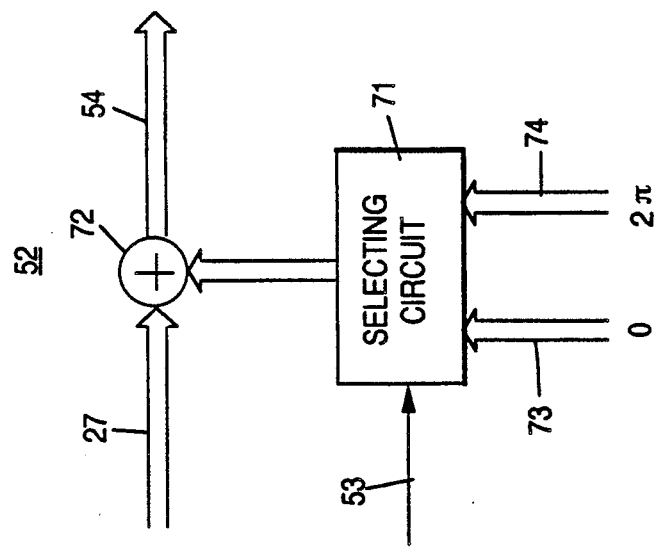
FIG. 4 is a block diagram of an example of a correction circuit used in the embodiment of the present invention.

A construction of the correction circuit 52 is shown in FIG. 4. A selecting circuit 71 selects one of a fixed signal 73 representing value 0 and a fixed signal 74 representing $2\pi$ according to the detection signal 53. If detection signal 53 indicates an occurrence of the over-modulation phenomenon, then selecting circuit 71 selects the signal 74. If the detection signal 53 does not indicate an occurrence of the over-modulation phenomenon, then selecting circuit 71 selects the signal 73. An addition circuit 72 thus adds the signal representing $2\pi$ to the signal 27 only when an over-modulation phenomenon occurs.

As a result, an output signal 54 of the addition circuit 72 becomes a demodulated signal free from the over-modulation phenomenon and is outputted from an output terminal 4 in FIG. 2.

The comparator 71 in FIG. 3 may be arranged to detect the over-modulation phenomenon by detecting that the signal 27 is negative. By this, the implementation can be made by a simpler circuit.

By the way, as in the case of $\lambda=0.9$ in FIG. 1, when, even if no over-modulation phenomenon has occured, the lower sideband signal of the reproduced FM signal is relatively large compared to the upper sideband signal, the dynamic range of the demodulated signal becomes extremely large. Therefore, the number of bits needed must be large for expressing the signal, involving a problem of an enlargement in the succeeding circuit scale. On the other hand, if amplitude limitation is made by an ordinary amplitude limiter to reduce the dynamic range, the level of the direct current component of the signal is changed. Now, with reference to the drawings, a description is provided of a second example of the correction circuit 52 shown in FIG. 2 which is designed to solve this problem.

Figure 5:
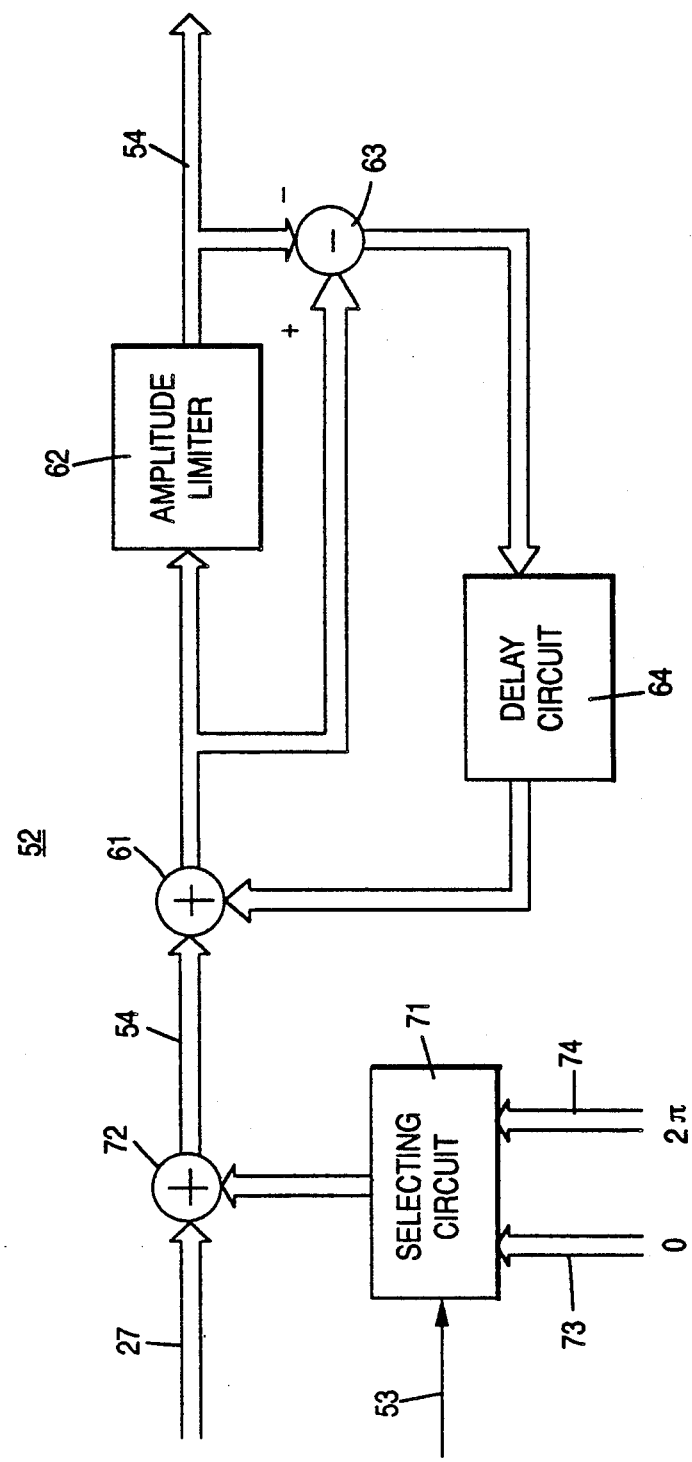
FIG. 5 is a block diagram of another example of a correction circuit used in the embodiment of the present invention.

FIG. 5 is a block diagram showing the second construction of the correction circuit 52 shown in FIG. 2. In FIG. 5, the same numbers are assigned to the same blocks and signals as those of the first construction shown in FIG. 4. A description is provided below on the points different from the correction circuit in FIG. 4.

In FIG. 5, a signal 56 from the addition circuit 72 is fed to one input of an addition circuit 61. An output signal of the addition circuit 61 is fed to an amplitude limiter 62. The amplitude limiter 62 limits the amplitude of its input signal to a predetermined value to make an output signal 54. On the other hand, in a subtraction circuit 63, an amplitude removed by the amplitude limiter 62 is obtained by taking a difference between the input signal and the output signal of the amplitude limiter 62. The output signal of the subtraction circuit 63 is delayed by one sampling period by a delay circuit 64, and then fed back to the other input terminal of the addition circuit 61 to be added to the signal 56. By this process, because the component removed by the amplitude limiter 62 is returned again and added to the signal 56, the direct current component of the signal 54 is equal to that of the signal 56. Further, the signal 56 has a small dynamic range limited by the amplitude limiter 62, so that the number of bits necessary for expressing the demodulated signal may be small, thus making it possible to minimize the scale of the succeeding circuit.

What is claimed is:

1. A digital frequency demodulating apparatus comprising:
    a phase detection means for detecting a phase of an input frequency-modulated signal;
    a differentiation means for time differentiating an output signal from said phase detection means to obtain a demodulated signal in proportion to an instantaneous frequency of said input frequency-modulated signal;
    an over-medium detection means for detecting an occurrence of an over-modulation of said input frequency-modulated signal according to an amplitude value of said demodulated signal from said differentiation means to generate a detection signal; and
    a correction means responsive to said detection signal for correcting said demodulated signal to obtain a demodulated output signal which has deterioration due to said over-modulation corrected.

2. A digital frequency demodulating apparatus as in claim 1, wherein said over-modulation detection means comprises:
    a comparison means for comparing a value of the demodulated signal from said differentiation means with a predeterminated reference value to generate a pulse having a duration corresponding to a duration of one over-modulation; and
    a detection signal generating means responsive to said pulse for generating said detection signal which is single pulse indicative of an occurrence of an over-modulation.

3. A digital frequency demodulating apparatus as in claim 1, wherein said correction means comprises an addition means for adding a value which represents $2\pi$ to said demodulated signal from said differentiation means according to said detection signal.

4. A digital frequency demodulating apparatus as in claim 1, wherein said correction means comprises:
    an addition means for adding a value which represents $2\pi$ to said demodulated signal from said differentiation means according to said detection signal; and
    an amplitude compression means for compressing an amplitude of an output signal from said addition means without losing a direct current component.

5. A digital frequency demodulating apparatus as in claim 4, wherein said amplitude compression means comprises:
    another addition means for adding the output signal from a said addition means and a delayed signal from delay means;
    an amplitude limitation means for limiting an amplitude of an output signal from said another addition means to obtain an output signal of the amplitude compression;
    a subtraction means for obtaining a difference between the amplitude of the output signal of said another addition means and an amplitude value of said output signal of the amplitude compression means;
    wherein said delay means delays an output of said subtraction means to obtain said delayed signal fed back to said another addition means.

* * * * *